United States Patent
Gharbi et al.

(10) Patent No.: US 12,073,153 B2
(45) Date of Patent: Aug. 27, 2024

(54) GENERATING VECTOR REPRESENTATIONS OF VISUAL OBJECTS

(71) Applicant: Adobe Inc., San Jose, CA (US)

(72) Inventors: Michaël Yanis Gharbi, San Francisco, CA (US); Niloy Jyoti Mitra, Potters Bar (GB); Michal Lukáč, Boulder Creek, CA (US); Chinthala Pradyumna Yanis Reddy, Newham (GB)

(73) Assignee: Adobe Inc., San Jose, CA (US)

( * ) Notice: Subject to any disclaimer, the term of this patent is extended or adjusted under 35 U.S.C. 154(b) by 878 days.

(21) Appl. No.: 17/166,937

(22) Filed: Feb. 3, 2021

(65) Prior Publication Data
US 2022/0245296 A1    Aug. 4, 2022

(51) Int. Cl.
G06F 30/20    (2020.01)
G06F 17/16    (2006.01)

(52) U.S. Cl.
CPC ............ *G06F 30/20* (2020.01); *G06F 17/16* (2013.01)

(58) Field of Classification Search
None
See application file for complete search history.

(56) References Cited

PUBLICATIONS

Alexandre Carlier et al., "DeepSVG: A Hierarchical Generative Network for Vector Graphics Animation", dated Oct. 22, 2020, 19 pages, https://arxiv.org/pdf/2007.11301.pdf (Year: 2020).*

Raphael Gontijo Lopes et al. "A Learned Representation for Scalable Vector Graphics", 2019, https://openaccess.thecvf.com/content_ICCV_2019/papers/Lopes_A_Learned_Representation_for_Scalable_Vector_Graphics_ICCV_2019_paper.pdf, 10 pages (Year: 2019).*

"Artistic Glyph Image Synthesis via One-Stage Few-Shot Learning", arXiv Preprint, arXiv.org [retrieved Mar. 12, 2021]. Retrieved from the Internet <https://arxiv.org/pdf/1910.04987.pdf>., May 19, 2020, 12 pages.

"CairoSVG", Kozea Group, GitHub, Inc. [retrieved Mar. 2, 2021]. Retrieved from the Internet <https://github.com/Kozea/CairoSVG>, Sep. 27, 2018, 2 pages.

"Creative Stall", Noun Project Inc. Website [retrieved Mar. 2, 2021]. Retrieved from the Internet <https://thenounproject.com/creative-stall/>., 3 pages.

"Noto-emoji", Google Fonts, GitHub Website [retrieved Apr. 12, 2021]. Retrieved from the Internet <https://github.com/googlefonts/noto-emoji>., Sep. 29, 2015, 4 pages.

Azadi, Samaneh et al., "Multi-Content GAN for Few-Shot Font Style Transfer", Proceedings of the IEEE Conference on Computer Vision and Pattern Recognition (CVPR) [retrieved Mar. 2, 2021]. Retrieved from the Internet <https://openaccess.thecvf.com/content_cvpr_2018/papers/Azadi_Multi-Content_GAN_for_CVPR_2018_paper.pdf>., Dec. 1, 2017, 10 pages.

(Continued)

*Primary Examiner* — Dov Popovici
(74) *Attorney, Agent, or Firm* — FIG. 1 Patents

(57) ABSTRACT

Generating vector representations of visual objects is leveraged in a digital medium environment. For instance, a raster-based visual input object is encoded into a global latent code and individual path latent codes for visual components of the raster visual object are extracted from the global latent code. The path latent codes are decoded and used to generate vector representations of the original raster versions of the visual components. The vector representations are rasterized and composited to generate an output object that simulates a visual appearance of the input object.

20 Claims, 10 Drawing Sheets
(1 of 10 Drawing Sheet(s) Filed in Color)

(56) References Cited

PUBLICATIONS

Bessmeltsev, Mikhail et al., "Vectorization of Line Drawings via PolyVector Fields", arXiv Preprint, arXiv.org [retrieved Mar. 2, 2021]. Retrieved from the Internet <https://arxiv.org/pdf/1801.01922.pdf>., Sep. 5, 2018, 12 pages.

Carlier, Alexandre et al., "DeepSVG: A Hierarchical Generative Network for Vector Graphics Animation", arXiv Preprint, arXiv.org [retrieved Mar. 2, 2021]. Retrieved from the Internet <https://arxiv.org/pdf/2007.11301.pdf>., Oct. 22, 2020, 19 pages.

Dominici, Eduardo A., "PolyFit: perception-aligned vectorization of raster clip-art via intermediate polygonal fitting", ACM Transactions on Graphics, vol. 39, No. 4, Article No. 77 [retrieved Mar. 2, 2021]. Retrieved from the Internet <https://open.library.ubc.ca/cIRcle/collections/ubctheses/24/items/1.0389752>., Apr. 2020, 57 pages.

Egiazarian, Vage et al., "Deep Vectorization of Technical Drawings", arXiv Preprint, arXiv.org [retrieved Mar. 9, 2021]. Retrieved from the Internet <https://arxiv.org/pdf/2003.05471.pdf>., Jun. 30, 2020, 41 pages.

Ellis, Kevin et al., "Learning to Infer Graphics Programs from Hand-Drawn Images", Advances in neural information processing systems 31 [retrieved Dec. 10, 2020]. Retrieved from the Internet <https://par.nsf.gov/servlets/purl/10088909>., Dec. 2017, 10 pages.

Favreau, Jean-Dominique et al., "Fidelity vs. Simplicity: a Global Approach to Line Drawing Vectorization", ACM Transactions on Graphics, Association for Computing Machinery, 2016, Proceedings of SIGGRAPH 2016 [retrieved Mar. 9, 2021]. Retrieved from the Internet <https://hal.inria.fr/hal-01309271/file/fidelity_simplicity.pdf>., Jul. 2016, 11 pages.

Ganin, Yaroslav et al., "Synthesizing Programs for Images using Reinforced Adversarial Learning", arXiv Preprint, arXiv.org [retrieved Mar. 9, 2021]. Retrieved from the Internet <https://arxiv.org/pdf/1804.01118.pdf>., Apr. 3, 2018, 12 pages.

Gao, Jun et al., "DeepSpline: Data-Driven Reconstruction of Parametric Curves and Surfaces", arXiv Preprint, arXiv.org [retrieved Mar. 9, 2021]. Retrieved from the Internet <https://arxiv.org/pdf/1901.03781.pdf>., Jan. 12, 2019, 13 pages.

Groueix, Thibault et al., "A Papier-Mache Approach to Learning 3D Surface Generation", 2018 IEEE/CVF Conference on Computer Vision and Pattern Recognition [retrieved Mar. 12, 2021]. Retrieved from the Internet <https://openaccess.thecvf.com/content_cvpr_2018/papers_backup/Groueix_A_Papier-Mache_Approach_CVPR_2018_paper.pdf>., Jun. 2018, 9 pages.

Guo, Yi et al., "Deep Line Drawing Vectorization via Line Subdivision and Topology Reconstruction", Computer Graphics Forum, vol. 38, No. 7 [retrieved Mar. 12, 2021]. Retrieved from the Internet <https://chuhan89.com/publication/guo-2019-deep/guo-2019-deep.pdf>., Nov. 14, 2019, 10 pages.

Ha, David et al., "A Neural Representation of Sketch Drawings", arXiv Preprint, arXiv.org [retrieved Mar. 18, 2021]. Retrieved from the Internet <https://arxiv.org/pdf/1704.03477.pdf>., May 19, 2017, 15 pages.

He, Kaiming et al., "Deep Residual Learning for Image Recognition", arXiv Preprint, arXiv.org [retrieved Mar. 18, 2021]. Retrieved from the Internet <https://arxiv.org/pdf/1512.03385.pdf>., Dec. 10, 2015, 12 pages.

Hoshyari, Shayan et al., "Perception-Driven Semi-Structured Boundary Vectorization", ACM Transactions on Graphics, vol. 37, No. 4, Article No. 118 [retrieved Mar. 18, 2021]. Retrieved from the Internet <https://www.ics.uci.edu/~majumder/vispercep/perception-driven-vectorization.pdf>., Jul. 2018, 14 pages.

Huang, Zhewei et al., "Learning to Paint With Model-Based Deep Reinforcement Learning", arXiv Preprint, arXiv.org [retrieved Mar. 18, 2021]. Retrieved from the Internet <https://arxiv.org/pdf/1903.04411.pdf>., Aug. 16, 2019, 11 pages.

Jayaraman, Pradeep K. et al., "UV-Net: Learning from Curve-Networks and Solids", arXiv Preprint, arXiv.org [retrieved Mar. 25, 2021]. Retrieved from the Internet <https://arxiv.org/pdf/2006.10211.pdf>., Jun. 18, 2020, 15 pages.

Kopf, Johannes et al., "Depixelizing Pixel Art", Proceedings of ACM Transactions on Graphics (TOG), vol. 30 Issue 4 [retrieved Mar. 25, 2021]. Retrieved from the Internet, <https://www.researchgate.net/profile/Dani-Lischinski/publication/220184192_Depixelizing_Pixel_Art/links/02e7e516bb52d7eff9000000/Depixelizing-Pixel-Art.pdf>., Jul. 1, 2011, 8 pages.

Lecun, Yann et al., "The MNIST Database of handwritten digits", [retrieved Apr. 6, 2021]. Retrieved from the Internet <http://yann.lecun.com/exdb/mnist/>., 1999, 7 pages.

Li, Tzu-Mao et al., "Differentiable Vector Graphics Rasterization for Editing and Learning", ACM Transactions on Graphics, vol. 39, No. 6 [retrieved Apr. 6, 2021]. Retrieved from the Internet <https://dl.acm.org/doi/pdf/10.1145/3414685.3417871>., Nov. 2020, 15 pages.

Liu, Chen et al., "Raster-to-Vector: Revisiting Floorplan Transformation", 2017 IEEE International Conference on Computer Vision (ICCV) [retrieved Apr. 6, 2021]. Retrieved from the Internet, <https://www.researchgate.net/profile/Jiajun-Wu-7/publication/322059565_Raster-to-Vector_Revisiting_Floorplan_Transformation/links/5bbab9e5299bf1049b748fdf/Raster-to-Vector-Revisiting-Floorplan-Transformation.pdf>., Oct. 2017, 9 pages.

Lopes, Raphael G. et al., "A Learned Representation for Scalable Vector Graphics", 2019 IEEE/CVF International Conference on Computer Vision (ICCV), vol. 1 [Apr. 12, 2021]. Retrieved from the Internet <https://openaccess.thecvf.com/content_ICCV_2019/papers/Lopes_A_Learned_Representation_for_Scalable_Vector_Graphics_ICCV_2019_paper.pdf>., Nov. 2019, 10 pages.

Nakano, Reiichiro, "Neural Painters: A learned differentiable constraint for generating brushstroke paintings", arXiv Preprint, Cornell University, arXiv.org [retrieved Apr. 12, 2021]. Retrieved from the Internet <https://arxiv.org/pdf/1904.08410.pdf>., Apr. 22, 2019, 15 pages.

Paschalidou, Despoina et al., "Superquadrics Revisited: Learning 3D Shape Parsing Beyond Cuboids", arXiv Preprint, Cornell University, arXiv.org [retrieved Apr. 12, 2021]. Retrieved from the Internet <https://arxiv.org/pdf/1904.09970.pdf>., <https://openaccess.thecvf.com/content_CVPR_2019/papers/Paschalidou_Superquadrics_Revisited_Learning_3D_Shape_Parsing_Beyond_Cuboids_CVPR_2019_paper.pdf>., Apr. 22, 2019, 21 pages.

Reddy, Pradyumna et al., "Discovering Pattern Structure Using Differentiable Compositing", arXiv Preprint, Cornell University, arXiv.org [retrieved Apr. 12, 2021]. Retrieved from the Internet <https://arxiv.org/pdf/2010.08788.pdf>., Oct. 17, 2020, 15 pages.

Ribeiro, Leo Sampaio F. et al., "Sketchformer: Transformer-based Representation for Sketched Structure", arXiv Preprint, Cornell University, arXiv.org [retrieved Apr. 12, 2021]. Retrieved from the Internet <https://arxiv.org/pdf/2002.10381.pdf>., 028/2482020, 9 pages.

Schuster, Mike et al., "Bidirectional Recurrent Neural Networks", IEEE Transactions on Signal Processing, vol. 45, No. 11 [retrieved Apr. 12, 2021]. Retrieved from the Internet <https://cin.ufpe.br/~fnj/RNA/BRNN.pdf>., Nov. 1997, 9 pages.

Selinger, Peter, "Potrace: a polygon-based tracing algorithm", [retrieved Apr. 12, 2021]. Retrieve from the Internet <https://citeseerx.ist.psu.edu/viewdoc/download?doi=10.1.1.159.5801&rep=rep1&type=pdf>., Sep. 20, 2003, 16 pages.

Sharma, Gopal et al., "CSGNet: Neural Shape Parser for Constructive Solid Geometry", arXiv Preprint, Cornell University, arXiv.org [retrieved Apr. 12, 2021]. Retrieved from the Internet <https://arxiv.org/pdf/1712.08290.pdf>., Mar. 31, 2018, 16 pages.

Simonyan, Karen et al., "Very Deep Convolutional Networks for Large-Scale Image Recognition", arXiv Preprint, Cornell University, arXiv.org [retrieved Apr. 12, 2021]. Retrieved from the Internet <https://arxiv.org/pdf/1409.1556.pdf>., Sep. 2014, 14 pages.

Sinha, Ayan et al., "SurfNet: Generating 3D Shape Surfaces Using Deep Residual Networks", arXiv Preprint, Cornell University, arXiv.org [retrieved Apr. 13, 2021]. Retrieved from the Internet <https://arxiv.org/pdf/1703.04079.pdf>., Mar. 12, 2017, 10 pages.

Smirnov, Dmitriy et al., "Deep Parametric Shape Predictions using Distance Fields", arXiv Preprint, Cornell University, arXiv.org [retrieved Apr. 13, 201]. Retrieved from the Internet <https://arxiv.org/pdf/1904.08921.pdf>., Mar. 19, 2020, 14 pages.

Smirnov, Dmitriy et al., "Learning Manifold Patch-Based Representations of Man-Made Shapes", arXiv Preprint, Cornell Univer-

(56) References Cited

PUBLICATIONS sity, arXiv.org [retrieved Apr. 13, 2021]. Retrieved from the Internet <https://arxiv.org/pdf/1906.12337.pdf>., Jun. 28, 2019, 24 pages.

Sutton, Richard S. et al., "Policy Gradient Methods for Reinforcement Learning with Function Approximation and Action-Dependent Baselines", NIPS'99: Proceedings of the 12th International Conference on Neural Information Processing Systems [retrieved Apr. 13, 2021]. Retrieved from the Internet <https://proceedings.neurips.cc/paper/1999/file/464d828b85b0bed98e80ade0a5c43b0f-Paper.pdf>., Nov. 1999, pp. 1057-1063.

Tong, Qianqian et al., "Calibrating the Adaptive Learning Rate to Improve Convergence of Adam", arXiv Preprint, Cornell Univeristy, arXiv.org [retrieved Apr. 13, 2021]. Retrieved from the Internet <https://arxiv.org/pdf/1908.00700.pdf>., Sep. 11, 2019, 50 pages.

Tulsiani, Shubham et al., "Learning Shape Abstractions by Assembling Volumetric Primitives", 2017 IEEE Conference on Computer Vision and Pattern Recognition (CVPR) [retrieved Apr. 13, 2021]. Retrieved from the Internet <https://openaccess.thecvf.com/content_cvpr_2017/papers/Tulsiani_Learning_Shape_Abstractions_CVPR_2017_paper.pdf>., Jul. 2017, 9 pages.

Zheng, Ningyuan et al., "StrokeNet: A Neural Painting Environment", 2019 International Conference on Learning Representations [retrieved Apr. 13, 2021]. Retrieved from the Internet <https://openreview.net/pdf?id=HJxwDiActX>., Sep. 27, 2018, 12 pages.

Zou, Chuhang et al., "3D-PRNN: Generating Shape Primitives with Recurrent Neural Networks", 2017 IEEE International Conference on Computer Vision (ICCV) [retrieved Apr. 13, 2021]. Retrieved from the Internet <https://openaccess.thecvf.com/content_ICCV_2017/papers/Zou_3D-PRNN_Generating_Shape_ICCV_2017_paper.pdf>., Oct. 2017, pp. 900-909.

\* cited by examiner

GENERATING VECTOR REPRESENTATIONS OF VISUAL OBJECTS

BACKGROUND

Digital graphics editing systems are implemented to generate and edit visual objects, such as digitally created visual objects, digital photographs, digital animations, and so forth. Vector graphics in particular are useful for generating and editing digital visual objects due to their compact data representations and increased scalability as compared with other forms of digital graphics, such as raster graphics. Current techniques for generating vector graphics, however, suffer from a number of deficiencies. For instance, manually generating vector graphics requires burdensome workflows by graphic designers to interact with a graphics editing system to manually specify vector graphic attributes. Accordingly, some generative techniques have been developed that utilize machine learning to attempt to provide automated ways for generating vector graphics. Conventional generative techniques, however, typically require supervision from training data including ground truth vector graphics sequences which are difficult to collect in large volumes. Furthermore, the mapping from sequences of parameterized drawing instructions to actual images is highly non-linear with respect to the parameters and also non-injective, allowing a variety of different sequences to produce the same visual result. This makes it difficult to consider appearance as a criterion for generative model training, and also causes the produced results to inherit structural bias inherent in training sequences.

Thus, vector graphic generation techniques in conventional graphics systems are burdensome on user and system resources (e.g., memory and processor bandwidth), require large sets of training data that are difficult and expensive to obtain, and/or do not achieve acceptable visual appearance in generated vector graphics objects.

SUMMARY

Generating vector representations of visual objects is leveraged in a digital medium environment. For instance, a raster-based visual input object is encoded into a global latent code and individual path latent codes for visual components of the raster visual object are extracted from the global latent code. The path latent codes are decoded and used to generate vector representations of the original raster versions of the visual components. The vector representations are rasterized and composited to generate an output object that simulates a visual appearance of the input object.

This Summary introduces a selection of concepts in a simplified form that are further described below in the Detailed Description. As such, this Summary is not intended to identify essential features of the claimed subject matter, nor is it intended to be used as an aid in determining the scope of the claimed subject matter.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The detailed description is described with reference to the accompanying figures. Entities represented in the figures are indicative of one or more entities and thus reference is made interchangeably to single or plural forms of the entities in the discussion.

DETAILED DESCRIPTION

Overview

Figure 1:
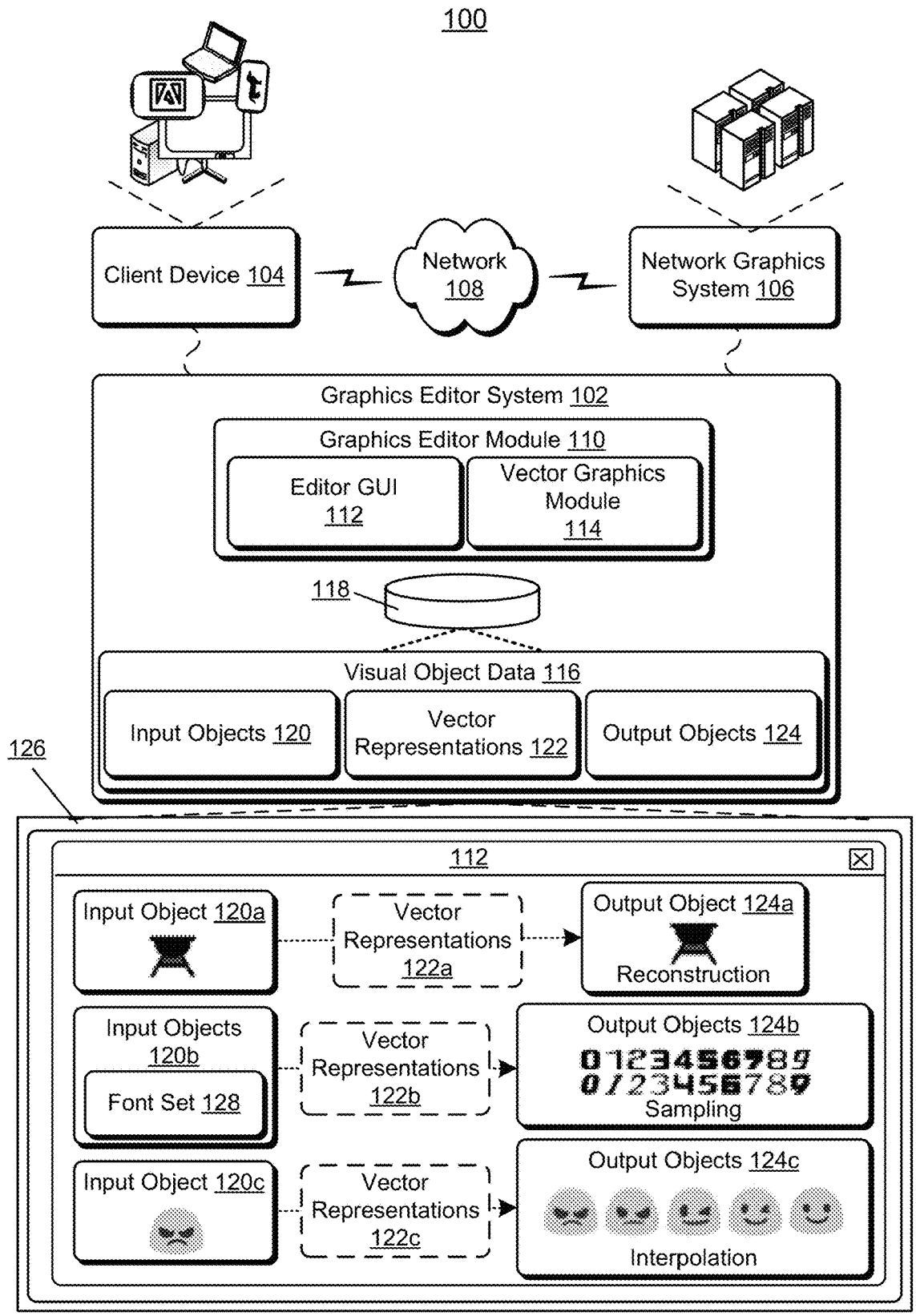
FIG. 1 is an illustration of an environment in an example implementation that is operable to employ techniques described herein.

To overcome the challenges to generating vector graphics presented in conventional graphics editing systems, generating vector representations of visual objects is leveraged in a digital medium environment. For instance, to mitigate the challenges of excessive burden on system resources experienced when generating vector representations of visual objects using conventional graphics editing systems, the described graphics editor system implements vector object generation techniques that reduce resource usage (e.g., memory and processor usage) in comparison with conventional vector object generation techniques, while providing high quality vector objects. Further, the described techniques are trainable using non-vector objects (e.g., raster images) and thus overcome the challenge of the lack of training data encountered in conventional techniques for generating vector graphics.

Consider, for example, an implementation in which a vector representation of a raster object (e.g., a raster-based image) is to be generated. Accordingly, an encoder module encodes the raster object to generate a global latent code representation of the raster object. In at least one implementation, encoding the raster object includes representing each visual component of the raster object (e.g., primitives and/or sets of primitives) as a closed path, e.g., a curved line with connected endpoints. Thus, the global latent code includes encoded representations of a collection of visual components that combine to form the input raster object.

A path decoder module decodes the global latent code to generate different path latent codes that each represent a respective visual component of the raster object. Each path latent code is then processed by a path decoder module to generate a vector representation of a respective visual component. The path decoder module, for example, starts with a data path representation for each path latent code (e.g., a circle) and places control points on the data path. In at least one implementation, a number of control points placed on the data path correlates to a geometric complexity of a visual component for each path latent code. For instance, more complex visual components are represented using more control points than less complex visual components.

After control points are generated on a data path, the path decoder module positionally adjusts at least some of the control points on the data path to enable the data path to be deformed to generate a corresponding vector representation. For instance, consider a visual component that includes different curves with different curvatures. In a data path representation of the visual component, control points are positionally adjusted on the data path to enable the data path to be deformed based on the curvature of the visual component. Accordingly, after adjusting at least some of the control points, the path decoder module deforms the data path relative to the control points to generate a vector representation of in input visual component. The path decoder module repeats this process for a set of path latent codes generated from the global latent code to generate a set of vector representations of visual components of the original raster object.

In at least one implementation, to enable visualization of the vector representations, a rasterizer module converts the vector representations into raster output and a compositor module arranges the raster output into a rasterized output object. For instance, as part of encoding the visual components into the global latent code, the visual components are labeled with position and depth information that describes coordinate position and visual depth of the visual components in the original input raster object. The compositor module utilizes this position and depth information to position the raster output into the rasterized output object to simulate the appearance of the original input raster object.

Accordingly, the described techniques provide a vector representation of a raster object that obtains the desirable attributes of vector objects including compact data representations and increased visual fidelity during image scaling in comparison with non-vector graphics. Further, the described techniques overcome the challenge of a lack of vector-based training data by utilizing raster graphics for system training and without requiring vector image data for training.

Further, system resources (e.g., memory and processor resources) utilized for generating vector graphics from raster graphics are conserved in contrast with conventional graphics editing techniques for generating vector graphics that often inaccurately reproduce visual appearance of target objects and thus require manual input and system resources to correct the generated vector graphics. In this way, computationally efficient generation of vector graphics provided by the described techniques are leveraged to reduce resource inefficiency experienced in conventional graphics editing systems and thus increase system efficiency.

Term Definitions

These term definitions are provided for purposes of example only and are not intended to be construed as limiting on the scope of the claims.

As used herein the terms "image" and "visual object" refer to digital visual content that is displayable and editable via a graphics editing system. For instance, "visual objects" include "input objects" such as raster images from which vector representations are generated, and "output objects" that are generated from vector representations of input objects.

As used herein the term "vector representation" refers to vector data that is generated to represent an input object, such as a raster image. A vector representation, for instance, is defined in terms of points on a Cartesian plane which are connected by lines and curves to form geometric primitives, polygons, and other shapes. Generally, a vector representation is convertible into a raster representation of an original input visual object.

As used herein the term "global latent code" refers to an encoded version of an input visual object. An encoder (e.g., a variational autoencoder (VAE)) encodes visual and structural attributes of an input visual object into a global latent code. In at least one implementation, the global latent code describes visual components of an input visual object, such as visual primitives and/or sets of primitives that combine to form a visual appearance of the input visual object.

As used herein the term "path latent code" refers to encoded versions of visual components of an input visual object that are extracted from a global latent code of the visual object. Each path latent code extracted from a global latent code, for instance, describes a different visual component of an input visual object.

In the following discussion, an example environment is first described that employs the techniques described herein. Example systems and procedures are then described which are performable in the example environment as well as other environments. Performance of the example systems and procedures is not limited to the example environment and the example environment is not limited to performance of the example systems and procedures. Finally, an example system and device are described that are representative of one or more computing systems and/or devices that are able to implement the various techniques described herein.

Example Environment

FIG. 1 is an illustration of an environment 100 in an example implementation that is operable to employ generating vector representations of visual objects as described herein. The illustrated environment 100 includes a graphics editor system 102 that is leveraged to implement techniques for generating vector representations of visual objects described herein. In this particular example, the graphics editor system 102 is implemented by a client device 104, a network graphics system 106, and/or via interaction between the client device 104 and the network graphics system 106. The client device 104 and the network graphics system 106, for example, are interconnected via a network 108 and thus are configured to communicate with one another to perform various aspects of generating vector representations of visual objects described herein. Generally, the network 108 represents a combination of wired and wireless networks and is implemented via any suitable architecture.

Examples of computing devices that are used to implement the client device 104 and the network graphics system 106 include a desktop computer, a laptop computer, a mobile device (e.g., assuming a handheld configuration such as a tablet or mobile phone), a server device, and so forth. Additionally, the network graphics system 106 is implementable using a plurality of different devices, such as multiple servers utilized by an enterprise to perform operations "over the cloud" as further described in relation to FIG. 10.

The graphics editor system 102 includes a graphics editor module 110 that is representative of functionality to enable visual objects to be generated and edited in various ways. Accordingly, the graphics editor module 110 implements an editor graphical user interface (GUI) 112 and a vector graphics module 114. Generally, the editor GUI 112 represents functionality for receiving user interaction to perform various visual object editing actions, as well as to output visual indications of visual object editing actions. Further, the vector graphics module 114 represents functionality for synthesizing vector-based graphics objects, such as utilizing techniques for generating vector representations of visual objects. In at least some implementations and as detailed below, the vector graphics module 114 leverages a set of machine learning algorithms for converting visual objects such as raster-based objects into corresponding vector objects.

The graphics editor system 102 further includes visual object data 116 stored on a storage 118. Generally, the visual object data 116 represents data that is utilized by and results from operation of the graphics editor module 110. The visual object data 116, for instance, includes input objects 120, vector representations 122, and output objects 124.

The input objects 120 represent different visual objects that are generated in a variety of different ways, such as obtained from a visual object source (e.g., the network graphics system 106), generated via user interaction with the graphics editor module 110, and so forth. Examples of the input objects 120 include graphical objects such as raster images, bitmap images, and so forth. The vector representations 122 correspond to vector representations of the input objects 120 generated by the vector graphics module 114. Further, the output objects 124 represent visual objects generated based on the vector representations 122. In at least one implementation, the output objects 124 are generated by rasterizing instances of the vector representations 122.

The graphics editor system 102 includes a display device 126 which represents functionality for visual output of various aspects of techniques for generating vector representations of visual objects. The display device 126, for instance, outputs the editor GUI 112, and is operable to receive user interaction to perform various aspects of the described techniques. A user, for example, provides input to the editor GUI 112 to invoke the vector graphics module 114. Additionally, functionality of the vector graphics module 114 is automatically invocable (e.g., by the graphics editor module 110), such as in response to receiving and/or generating instances of the input objects 120.

To illustrate different capabilities of techniques for generating vector representations of visual objects, the editor GUI 112 depicts different input objects 120 and output objects 124 generated by the vector graphics module 114 based on the input objects 120. The vector graphics module 114, for example, generates different vector representations 122 based on the input objects and then generates the output objects 124 as visual depictions of the different vector representations. An input object 120a, for example, is input to the vector graphics module 114 and processed by the vector graphics module 114 to generate an output object 124a. In this particular example, the output object 124a results from utilizing the vector graphics module 114 to generate a vector representation 122a of the input object 120a and converting the vector representation 122a into the output object 124a as a reconstruction of the input object 120a.

Further, input objects 120b are processed by the vector graphics module 114 to generate vector representations 122b of the input objects 120b, which are utilized to generate output objects 124b. The vector representations 122b, for example, are generated by sampling different data values generated as part of vectorizing the input objects 120b, e.g., from a latent space encoded from the input object 120b. The vector representations 122b are then utilized to generate the output objects 124b. In this particular example, the input objects 120b include a font set 128 that is used to generate the vector representations 122b, and thus the output objects 124b correspond to visual objects generated based on different vector representations 122b generated from different instances of the font set 128.

To illustrate an example of interpolation, an input object 120c is processed by the vector graphics module 114 to generate vector representations 122c which are then utilized to generate output objects 124c. The vector representations 122c, for example, are generated by interpolating on a latent space obtained from encoding the input object 120c.

These particular examples are presented for purpose of illustration only, and it is to be appreciated that techniques for generating vector representations of visual objects are utilizable to perform a variety of different graphics operations. Having considered an example environment and system, consider now a discussion of some example details of the techniques for generating vector representations of visual objects in a digital medium environment in accordance with one or more implementations.

Implementation Details

Figure 2:
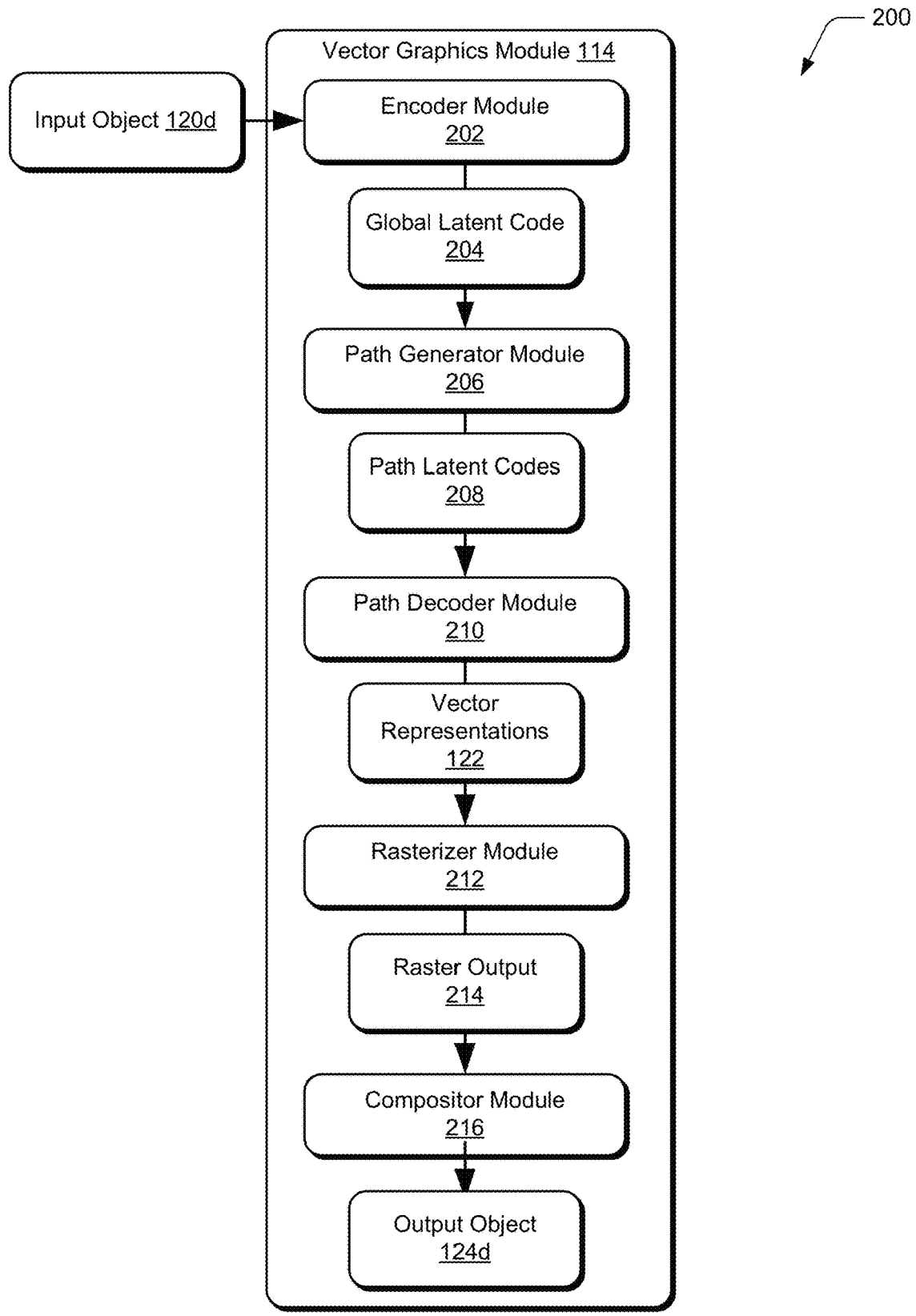
FIG. 2 depicts an example system for generating a vector graphic from an input visual object according to the techniques described herein.

FIGS. 2-6 depict different implementation details for generating vector representations of visual objects in accordance with one or more implementations. For instance, FIG. 2 depicts an example system 200 for generating a vector graphic from an input visual object according to the techniques described herein. The system 200, for example, describes implementation of the vector graphics module 114 via various modules that perform different operations. Generally, the various modules discussed herein are implementable in hardware, firmware, software, and/or combinations thereof.

In the system 200, the vector graphics module 114 receives an input object 120d and an encoder module 202 encodes the input object 120d to generate a global latent code 204. In at least one implementation, the encoder module 202 is implemented as a variational autoencoder that maps the input object 120a (e.g., a raster image) to a global latent variable z, e.g., the global latent code 204. In a non-limiting example, the architecture of the encoder module 202 includes five 2-dimensional convolutional residual blocks with [32, 64, 128, 256, 512] filters, respectively. Further, the convolution layers have kernel size 3, stride 2 and zero pad the input by 1 pixel in both spatial dimensions from the input object 120d. In such an implementation, convolutional layers of the encoder module 202 are followed by two parallel fully connected layers that each output a vector of size 128 as part of the global latent code 204. As further detailed below, the global latent code 204 includes a set of T closed paths (e.g., sets of Bézier paths, Bézier curves) that combine to represent the input object 120d.

Continuing, the global latent code 204 is input to a path generator module 206 which processes the global latent code 204 to generate path latent codes 208. In at least one implementation, the path generator module 206 is implemented as a recurrent neural network (RNN). For instance, each of the T closed paths encoded by the encoder module 202 from the global latent variable z is decoded by the path generator module 206 to generate the path latent codes 208. At each time step t, for example, the path generator module 206 outputs a per-path latent code $z_t$ which combine to generate the path latent codes 208. The path latent codes 208 are then individually processed by a path decoder module 210 to generate the vector representations 122 of the input object 120d. For each path latent code 208, for example, the path decoder module 210 outputs a vector representation 122 as parameters of a closed path of arbitrary length, such as using a cubic Bézier segment. Operation of the path decoder module 210 is detailed below in FIGS. 3 and 5.

Further to the system 200, a rasterizer module 212 takes the vector representations 122 as input and rasterizes the vector representations 122 to generate raster output 214. For example, for each vector representation 122, the rasterizer module 212 generates a rasterized version of a closed path that represents a raster output 214 representation of the vector representation 122. A compositor module 216 then takes the raster output 214 and composites the raster output 214 to generate an output object 124d. As further detailed below, the path generator module 206 generates the path latent codes 208 to include depth and position values for the path latent codes 208. Accordingly, the compositor module 216 utilizes the depth and position values to place the closed curves from the raster output 214 in appropriate positions and depths to generate the output object 124d.

In at least one implementation, the vector graphics module 114 is trained end-to-end using the global latent code 204 obtained from the input object 120a for 100-1000 epochs and using a batch size between 2-256. Further, to evaluate generalization to a variable number of segments by the path decoder module 210, training includes randomly choosing a number of segments k∈{7, ..., 25} at each training iteration. Thus, the described model is trained using the raster input object 120d (e.g., as ground truth utilized for supervision) and without requiring vector-based supervision.

Figure 3:
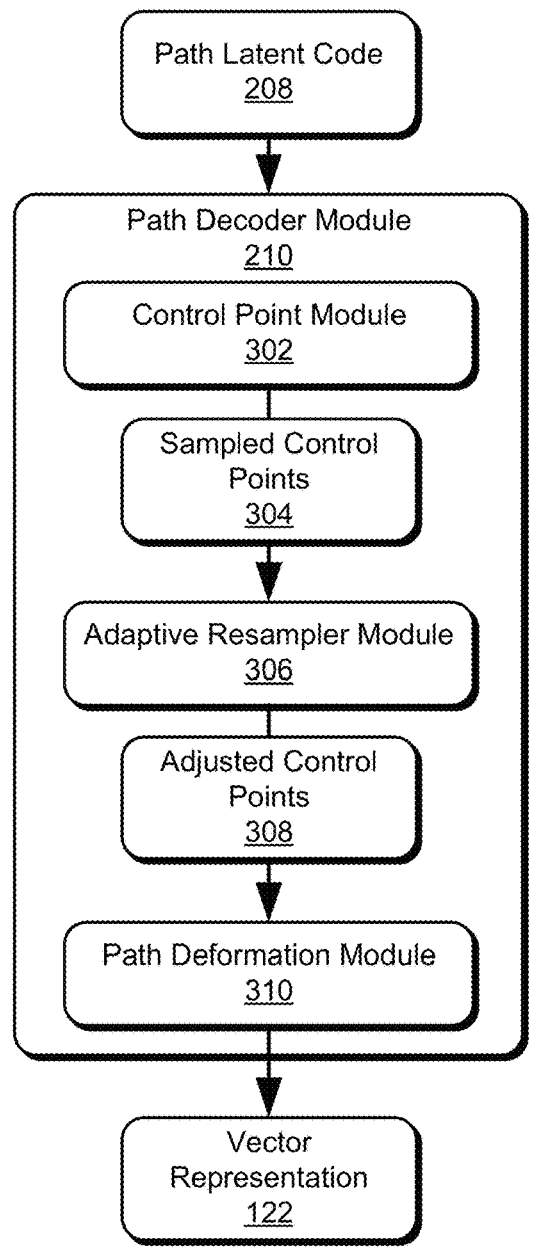
FIG. 3 depicts an example system for generating a vector representation from an encoded latent representation of a raster path of a raster object.

FIG. 3 depicts an example system 300 for generating a vector representation from a data path representation of a visual component of an input object. The system 300, for instance, describes detailed operation of the path decoder module 210. In the system 300, the path decoder module 210 takes a path latent code 208 as input and a control point module 302 generates sampled control points 304 for a data path described by the path latent code 208. Generally, the control point module 302 predicts an optimal number of control points 304 to be used to represent the data path, such as based on a geometry of a visual component represented by the data path. Example operation of the control point module 302 is described below.

An adaptive resampler module 306 takes the sampled control points 304 and positionally adjusts the control points 304 to generate adjusted control points 308. The adaptive resampler module 306, for example, processes the control points 304 to determine spatial locations of the control points 304 along the data path described by the path latent code 208 and positions each control point 304 at the determined spatial location to generate the adjusted control points 308. A path deformation module 310 then processes the path latent code 208 to generate a vector representation 122 of the path latent code 208. The path deformation module 310, for instance, deforms a data path described by the path latent code 208 and using the adjusted control points 308 to generate the vector representation 122. The vector representation 122 is then utilized to generate an output object 124 as described throughout.

Figure 4:
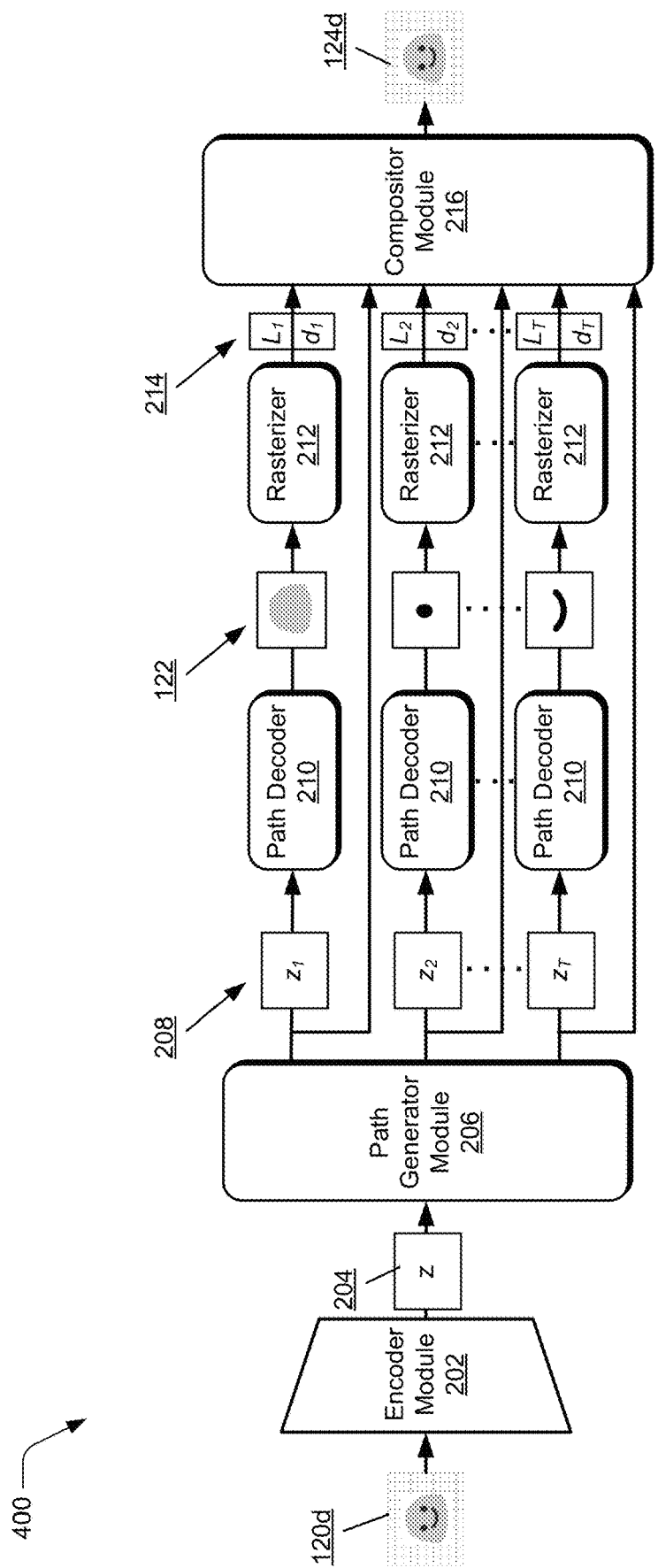
FIG. 4 depicts an example system for aspects of generating vector representations of visual objects.

FIG. 4 depicts an example system 400 for aspects of generating vector representations of visual objects described herein. The system 400, for example, provides additional detail concerning operation of the system 200 introduced above. In the system 400, the input object 120d is encoded by the encoder module 202 to generate the global latent code 204, represented as z. The path generator module 206 then processes (e.g., decodes) the global latent code 204 to generate different path latent codes 208, which in this example include path codes $z_1, z_2, \ldots z_T$. Each path latent code 208 is then decoded by the path decoder module 210 to generate a respective vector representation 122. The vector representations 122, for example, depict vector representations of visual components described by each path latent code 208. As illustrated, each vector representation 122 represents a component of the input object 120d, e.g., a vector representation of a raster-based component of the input object 120d.

Further to the system 400, the rasterizer module 212 takes the vector representations 122 as input and generates raster output 214 for each vector representation 122, here represented as raster output $L_1, L_2, \ldots L_T$. Further, each raster output 214 (L) includes depth information d, including $d_1, d_2, \ldots d_T$. The compositor module 216 composites the raster output 214 to generate the output object 124d. The compositor module 216, for example, utilizes the depth information d as well as spatial coordinate information for each raster output 214 to generate the output object 124d. Thus, the output object 124d represents raster output of the vector representations 122 of the raster-based input object 120d.

According to various implementations, each step in the system 400 is differentiable. Accordingly, as part of training the system 400, a loss between input object 120d and rasterized generated output object 124d is calculated, and the calculated loss is backpropagated to train the system 400 using gradient descent. For instance, when output object 124d is differentiated with respect to parameters of the corresponding vector representations 122 (e.g., Bézier parameters), the gradients have a small area of influence such as corresponding to support of a rasterization prefiltering kernel implemented by the rasterizer module 212. In at least one implementation, this adversely affects convergence of the system 400 such as when the mismatch between the input object 120d and the output object 124d is high, e.g., at the early stages of the training. Accordingly, this issue is alleviated by rasterizing the vector representations 122 at multiple resolutions. For instance, an image pyramid at different resolutions (e.g., different pixel resolutions) is rendered from the vector representations 122 instead of a single image, and the loss is calculated and aggregated at each pyramid level. Further, ground truth supervision is obtained for each level by decomposing the input object 120d into a Gaussian pyramid, where each level is downsampled by a factor of 2 along each dimension from a previous level on the pyramid. In at least one implementation, the gradients at the coarsest level are more stable and provide a signal when the input object 120d and the output object 124d differ significantly, while the fine-scale gradients are usable in obtaining high spatial accuracy. The loss minimized is given by:

$$\mathbb{E}_{I \sim D} \sum_{l=1}^{L} \|pyr_l(I) - outputobject_l\|^2$$

where $\mathbb{E}$ is the loss value, L is the number of pyramid levels, $pyr_l(I)$ the l-th pyramid level, $outputobject_l$ is the output object rasterized at the corresponding spatial resolution, and D the training dataset, e.g., from the input object 120d. Thus, the system 400 is trainable in this way to enable more accurate visual correspondence between an output object 124 and an input object 120.

Figure 5:
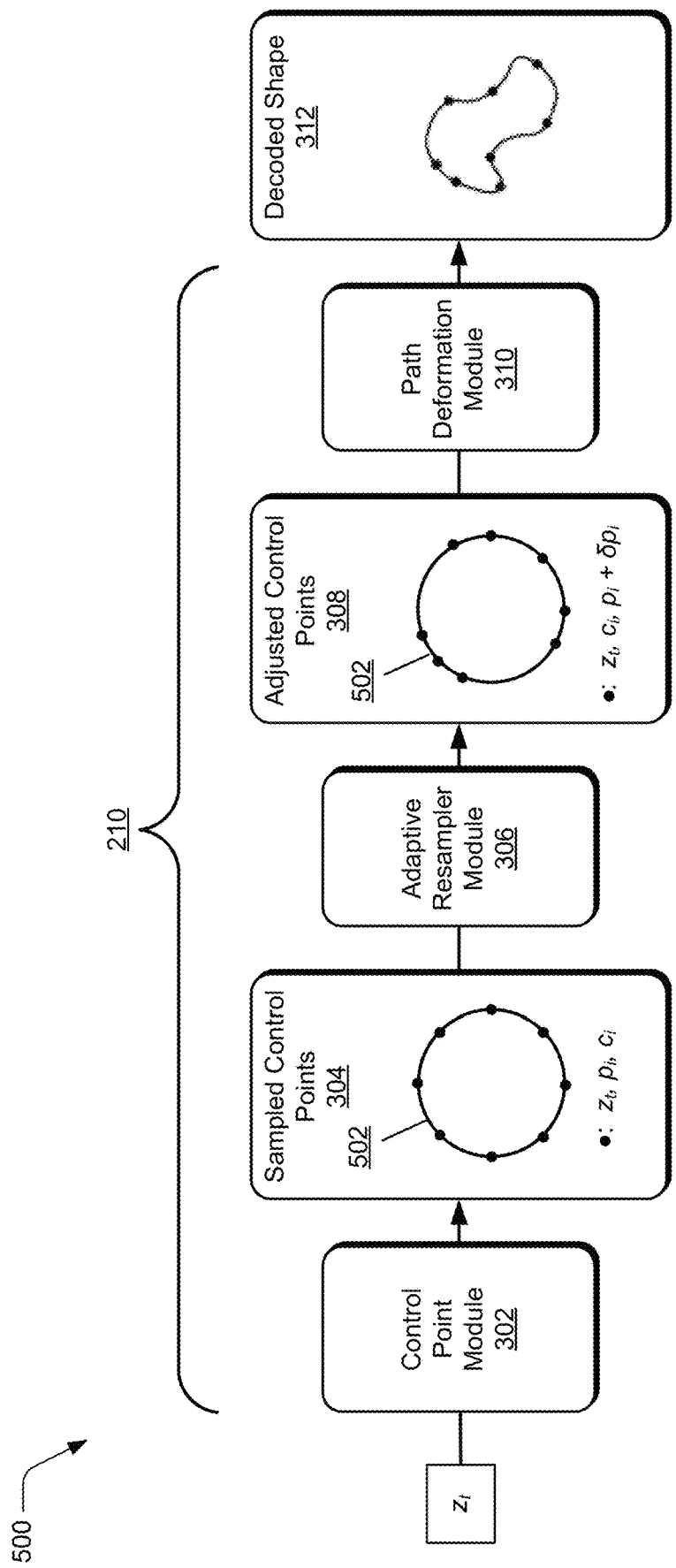
FIG. 5 depicts an example system illustrating example operation of a path decoder.

FIG. 5 depicts a system 500 illustrating example operation of the path decoder module 210. In the system 500, the control point module 302 takes a path latent code 208 ($z_t$) as input. The control point module 302 processes the path latent code 208 to generate sampled control points 304 for a data path 502 described by the path latent code 208. The control point module 302, for instance, generates the sampled control points 304 as an optimal number of control points to be used to deform the data path 502 to visually represent a visual component described by the path latent code 208. In at least one implementation, the control point module 302 generates 3k control points along the data path 502, with k representing a number of segments (e.g., cubic Bézier segments) along the data path 502. For instance, every third control point 304 represents an endpoint of a segment of the data path 502.

In this particular example, each of the sampled control points 304 is represented by $z_t$, cartesian coordinates $p_i$ for the control point 304, and a variable $c_i$ which distinguishes segment endpoints from other control points 304. For instance, $c_i$ is implemented as a one-hot binary variable that identifies whether a particular control point 304 is an endpoint of a segment of the data path 502 or is a different type of control point, e.g., not a segment endpoint. Thus, each control point 304 is represented by a vector $[p_i, c_i, z_t]$, i∈{1, . . . , 3k}, which is referred to herein as a fused latent vector.

In at least one implementation, the control point module 302 includes a neural network, such as a convolutional neural network (CNN). In one such example, the control point module 302 is implemented with 4 fully connected layers with [256, 256, 256, 3] channels, respectively. Accordingly, to position the control points 304 on the path 502, the control point module 302 places the control points 304 into a cyclic buffer which is then processed by the control point module 302 performing 1D convolutions with cyclic boundary conditions (along the sample dimension of the data path 502) to obtain spatial locations of the control points 304 along the data path 502, represented as $x_1, \ldots, x_{3k}$. This cyclic convolution along a sample axis corresponds to convolution along the perimeter of the data path 502.

According to various implementations, generating control points 304 along the data path 502 enables shape complexity (e.g., number of segments k) to be adjusted by changing control point density along the data path 502. For instance, the control point module 302 is trained on a path latent variable $z_t$ to model a complexity-fidelity trade-off and automatically determine the optimal number of segments for a path, e.g., the data path 502. In at least one implementation, the control point module 302 has 3 fully connected layers and outputs 3 parameters a, b, and c of a parametric curve x→$ae^{-bx}$+c that approximates the loss graph of a given shape, with respect to the number of segments. Specifically, we solve for x in the derivative expression above and round up to obtain the number of segments k to sample. Thus, the control point module 302 is trainable separately from the end-to-end training of the overall vector graphics module 114.

As mentioned above, determining a number of segments for a particular given path (e.g., the data path 502) involves balancing the fidelity of the final deformation of the path to an original shape represented by the path latent variable $z_t$. For instance, more complex shapes typically involve more segments than less complex shapes to achieve a particular level of fidelity. Thus, the control point module 302 is configured to determine a number of segments for the data path 502 utilizing a specified reconstruction loss that represents a variance of a deformed path from an original shape, e.g., the fidelity of the deformed path to the original shape. Accordingly, a default loss value can be utilized and/or a user is enabled to specify a desired loss value. For instance, a user specifies a level of fidelity based on a quality trade-off as a threshold on the derivative of the parametric curve above. Generally, this enables a user to consider whether higher fidelity and thus higher system resource consumption (e.g., processor bandwidth, memory, and so forth) is preferred, or lower fidelity and thus lower system resource consumption.

Accordingly, after determining a number of control points 304 for the data path 502, the adaptive resampler module 306 takes the sampled control points 304 as input and positionally adjusts the control points 304 on the data path 502 to generate the adjusted control points 308. In at least one implementation, the adaptive resampler module 306 is implemented as a 1D convolutional network with cyclic boundary condition acting on the fused latent vectors $[p_i, c_i, z_t]$, where the $p_i$ are uniformly spaced along the path 502 as depicted in the sampled control points 304. The adaptive resampler module 306 outputs a displacement $\delta p_i$ for each sampled point and this output is parameterized in polar coordinates so that $p_i + \delta p_i$ remains on the data path 502. The path deformation module 310 then operates on the fused latent vector with sample deformation $[p_i+\delta p_i, c_i, z_t]$, (e.g., instead of the regularly-spaced positions depicted in the sampled control points 304) to generate the decoded shape 312. As referenced above, the decoded shape 312 is utilized to generate a corresponding vector representation 122 of a corresponding visual component (e.g., shape) from an input object 120 from the path latent code 208a, e.g., $z_t$.

In at least one implementation, the path decoder module 210 is implemented as six 1D convolution layers with [170, 340, 340, 340, 340, 340, 2] channels. Further, the 1D convolutions have kernel size 3, stride 1 and circular padding of the input by 1 tap. Further, the adaptive resampler module 306 includes three 1D convolution layers with [340, 340, 1] channels, with the convolution layers having the same kernel size, stride and padding as the 1D convolution layers in the path decoder module 210. In at least one implementation, the layers are followed by rectified linear activation function (ReLU) activations, except the last layer of the path decoder module 210 which is followed by a sigmoid activation.

Figure 6:
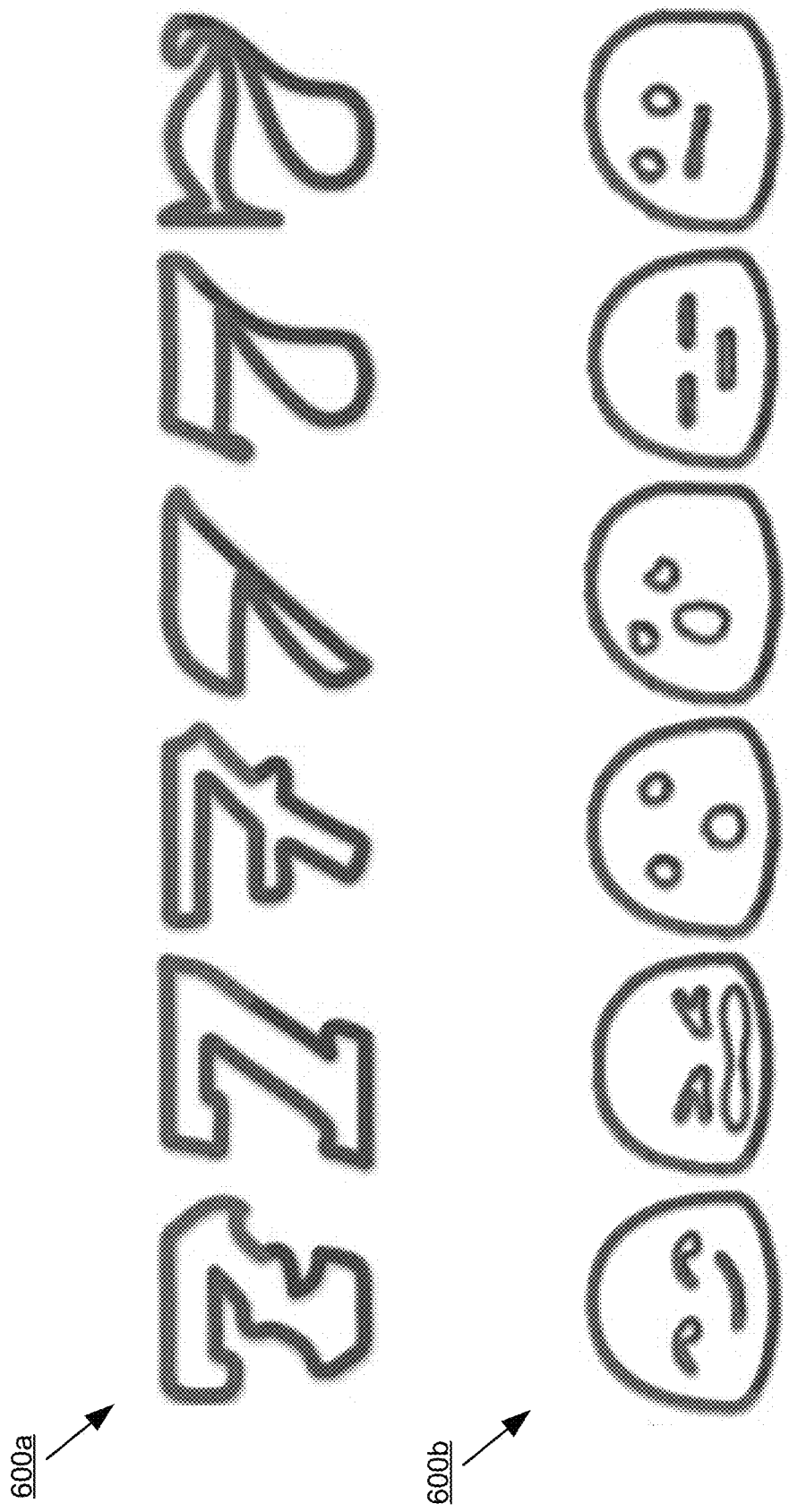
FIG. 6 illustrates that the techniques for generating vector representations of visual objects described herein provide point-to-point correspondence between visual components across visual objects.

FIG. 6 illustrates that the techniques for generating vector representations of visual objects described herein provide point-to-point correspondence between shapes across visual objects. For instance, two shape sets 600a, 600b are depicted and are color coded to illustrate correspondence between different visual components (e.g., segments) of the individual shapes in the shape sets. Generally, this segmentation is captured when the shapes are encoded into a respective latent space z. In at least one implementation, the shape sets 600 represent sets of the output objects 124.

As illustrated, visual objects include objects made of a single path as in shape set 600a or multiple paths as in shape set 600b. Generally, the described techniques establish meaningful geometric correspondences between segments in each visual object, indicated by the red green blue (RGB) color coding. In implementations for utilizing a generative model according to an instance of a class of visual objects, e.g., the same glyph or digit across multiple fonts, it is often desirable that the model's latent space capture correspondences between parts of the instance, such as the eyes and mouth of an emoji face as depicted in the shape set 600b. To enable this, the raster training dataset from an input object 120 is segmented and the segments are clustered across the dataset based on spatial position from the input object 120. Each cluster is assigned a unique identifier across a set of shapes, which is shown in the shape sets 600a, 600b as corresponding RGB colors with each instance of an RGB color identifying a corresponding segment across each shape in a respective shape set 600. Generally, this consistent segment labeling helps generate a more interpretable latent space for purposes of interpolation but is not required according to the described implementations.

Figure 7:
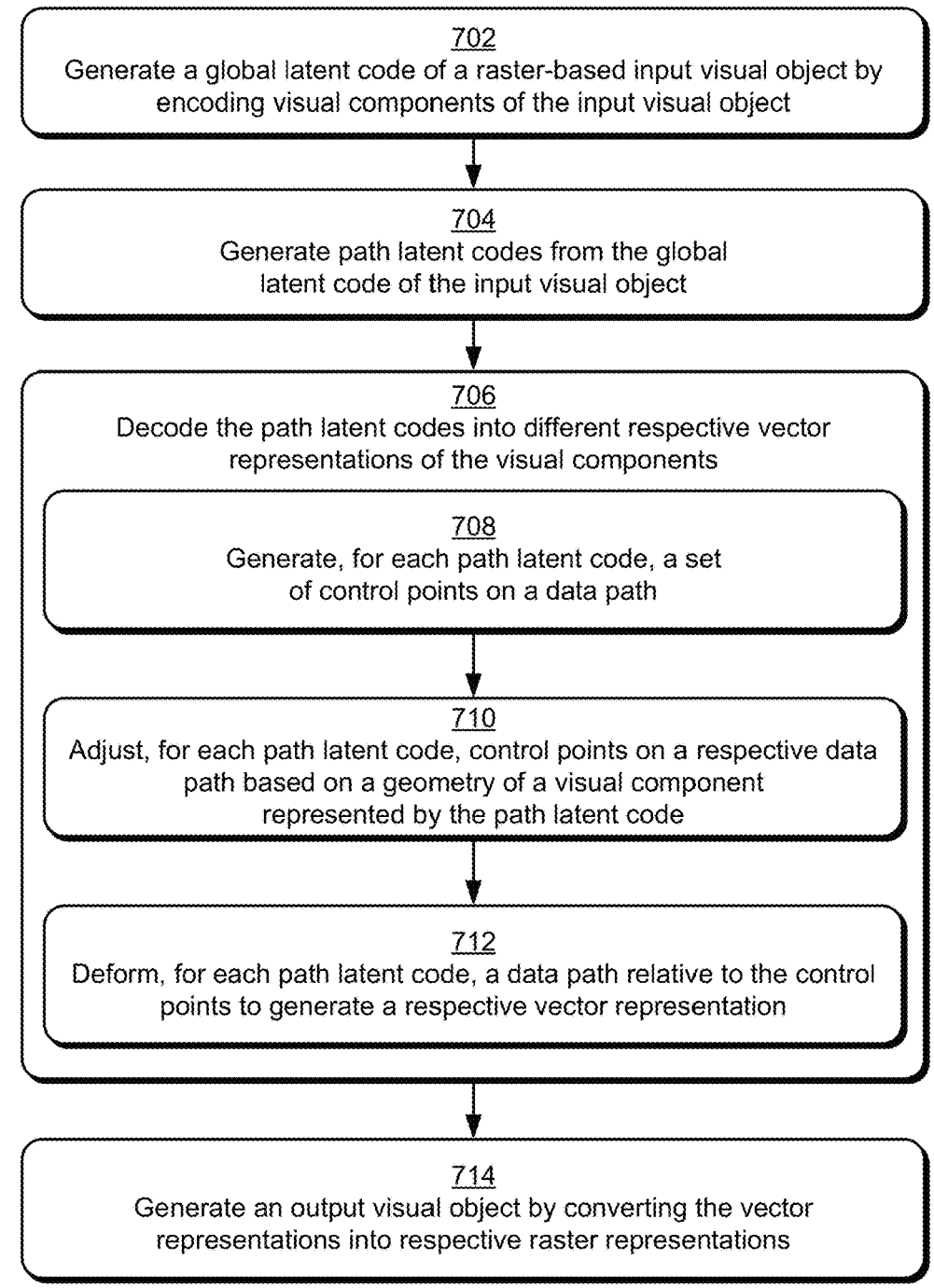
FIG. 7 depicts an example procedure for generating vector representations of visual objects.

Having discussed some implementation details, consider now some example methods for generating vector representations of visual objects. FIG. 7, for instance, depicts an example general method 700 for generating vector representations of visual objects. In at least one implementation, the method is performed by the graphics editor module 110 utilizing the vector graphics module 114. Step 702 generates a global latent code of a raster-based input visual object by encoding visual components of the input visual object. The encoder module 202, for instance, encodes visual components of an input object 120 into the global latent code 204. In at least one implementation, the visual components are encoded as vectors that represent closed data paths made up of sets of curves, e.g., Bézier curves.

Step 704 generates path latent codes from the global latent code of the input visual object by decoding the global latent code into different individual path latent codes. For example, the path generator module 206 decodes the global latent code 204 into different individual path latent codes 208 that each represent a different visual component of the input object 120.

Step 706 decodes the path latent codes into different respective vector representations of the visual components. The path decoder module 210, for example, decodes each path latent code 208 into a respective vector representation 122. In at least one implementation, generating the vector representations 122 from the path latent codes 208 includes: Step 708 generates, for each path latent code, a set of control points on a data path. The control point module 302, for example, generates a data representation of a data path (e.g., a circular path) and places control points along the data path, such as equidistant from one another along the data path. In at least one implementation, a number of control points generated along the data path for a particular path latent code 208 is determined based on a geometric and/or visual complexity of a particular visual component represented by the particular path latent code 208. For instance, utilizing more control points enables more complex path deformations to be performed.

Step 710 adjusts, for each path latent code, control points on a respective data path based on a geometry of a visual component represented by the path latent code. The adaptive resampler module 306, for instance, adjusts a position of at least some control points on a data path to enable the data path to simulate a geometry of a respective visual component. Step 712 deforms, for each path latent code, a data path relative to the control points to generate a respective vector representation. For example, the path deformation module 310 deforms each data path about the adjusted control points to cause the data path to simulate a visual component represented by the data path.

Step 714 generates an output visual object by converting the vector representations into respective raster representations. The rasterizer module 212, for instance, converts the vector representations 122 into respective raster output 214 and the compositor module 216 composites the raster output 214 into an output object 124. Individual raster representations of the raster output 214 include position information (e.g., position coordinates) and depth information (e.g., z values) such that the compositor module 216 places the raster representations in appropriate positions and depths as part of the output object 124. In least one implementation, the output object 124 is displayed on a display device, such as part of the editor GUI 112 of the graphics editor module 110.

Figure 8:
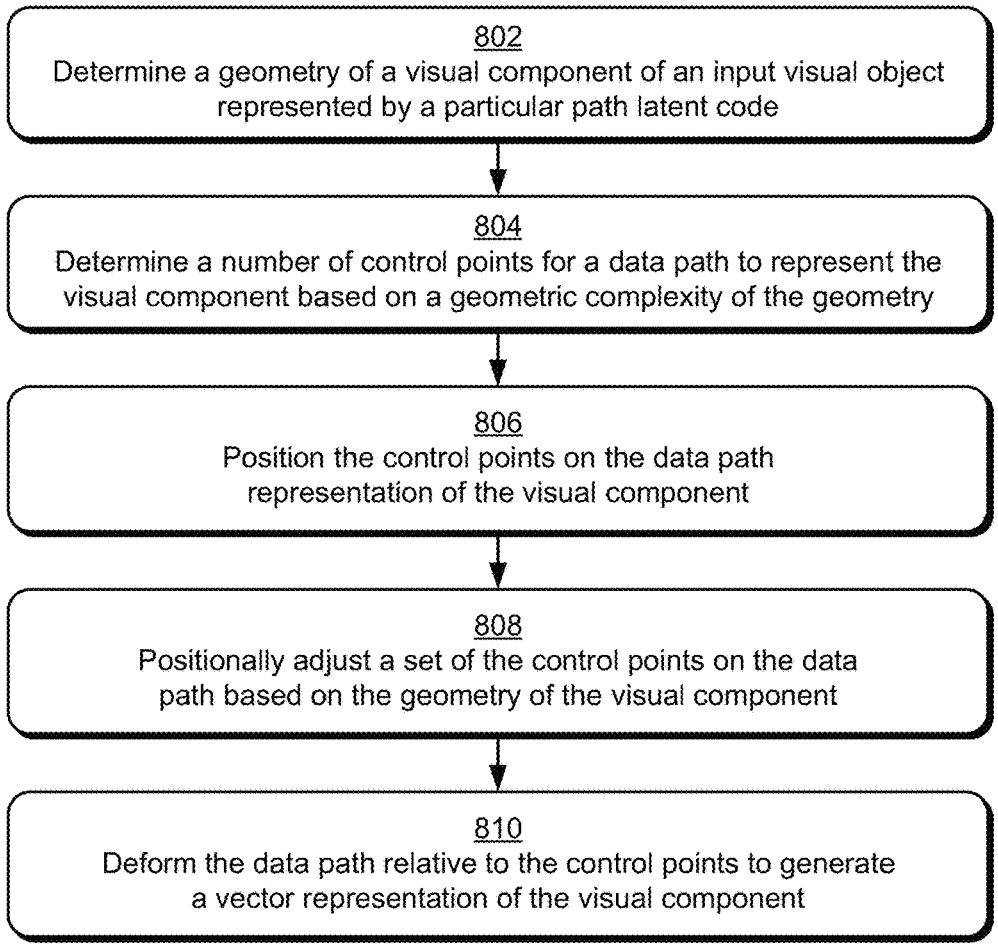
FIG. 8 depicts an example procedure for generating a vector representation of a visual component of an input visual object.

FIG. 8 depicts an example method 800 for generating a vector representation of a visual component of an input visual object in accordance with one or more implementations. Step 802 determines a geometry of a visual component of an input visual object represented by a particular path latent code. The control point module 302, for example, determines a geometry of a particular visual component represented by a path latent code 208. In at least one implementation, a visual component is represented as a geometric primitive and/or set of primitives. Generally, a geometry of a visual component refers to a shape and visual arrangement of the visual component, such as curves, lines, and/or angles that combine to form the visual component.

Step 804 determines a number of control points for a data path to represent the visual component based on a geometric complexity of the geometry. For instance, the control point module 302 determines a number of control points to be placed on a data path representation of a visual component to correspond to a geometric complexity. A simple visual component such as a straight line, for instance, utilizes fewer control points (e.g., 3 control points) than a more geometrically complex visual component, such as a visual component that includes multiple different angles and/or changes in curvature.

Step 806 positions the control points on the data path representation of the visual component. In at least one implementation, the control point module 302 places the control points equidistantly from one another along the data path and labels each control point as either a segment endpoint or not a segment endpoint. Step 808 positionally adjusts a set of the control points on the data path based on the geometry of the visual component. The adaptive resampler module 306, for example, positions control points at portions of the data path that correlate to geometrically complex sections of the visual component, such as sections that have changes in angle and/or multiple different angles. In at least one implementation this is performed by generating displacement values for the set of control points and positionally adjusting the set of control points on the data path based on respective displacement values.

Step 810 deforms the data path relative to the control points to generate a vector representation of the visual component. For instance, the path deformation module 310 deforms the data path about the control points such as by manipulating individual control points to change curvature of segments of the data path to simulate the geometry (e.g., visual appearance) of the visual component. Accordingly, the vector representation is then usable to combine with other vector representations of visual components to generate an output object 124.

Figure 9:
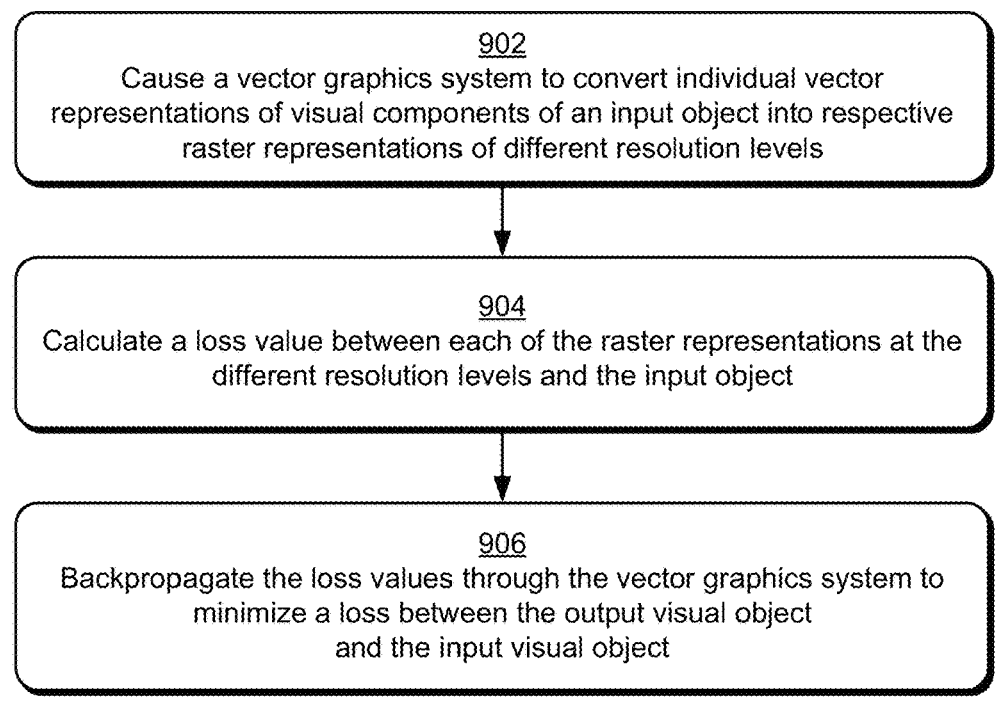
FIG. 9 depicts an example procedure for training a vector graphics system.

FIG. 9 depicts an example method 900 for training a vector graphics system in accordance with one or more implementations. The method, for example, is implementable to train the vector graphics module 114 to generate vector representations of input objects 120. Step 902 causes a vector graphics system to convert individual vector representations of visual components of an input object into respective raster representations of different resolution levels. The vector graphics module 114, for instance, implements the rasterizer module 212 to convert individual vector representations 122 into respective raster representations of different visual resolution levels. Generally, this enables the vector graphics module 114 to obtain raster representations of individual vector representations 122 at multiple different resolution levels.

As discussed above for example, for each vector representation 122, a hierarchical data structure (e.g., a pyramid) is generated and each level of the hierarchical structure is populated with a different respective raster representation of a particular resolution. Thus, the hierarchical structure is traversable to obtain raster representations of the vector representation at different resolutions.

Step 904 calculates a loss value between each of the raster representations at the different visual resolution levels and the input object. The vector graphics module 114, for example, calculates a loss value between each of the raster representations at the different visual resolution levels and a visual component of the input visual object represented by the raster representations.

Step 906 backpropagates the loss values through the vector graphics system to minimize a loss between the output visual object and the input visual object. For instance, the vector graphics module 114 backpropagates the loss values through the system to minimize a loss between an output object 124 and a corresponding input object 120. Generally, this increases a visual fidelity of an output object 124 to a corresponding input object 120.

The example methods described above are performable in various ways, such as for implementing different aspects of the systems and scenarios described herein. For instance, aspects of the methods are implemented by the graphics editor module 110 and various aspects of the methods are implemented via the different GUIs described above. Generally, any services, components, modules, methods, and/or operations described herein are able to be implemented using software, firmware, hardware (e.g., fixed logic circuitry), manual processing, or any combination thereof. Some operations of the described methods, for example, are described in the general context of executable instructions stored on computer-readable storage memory that is local and/or remote to a computer processing system, and implementations include software applications, programs, functions, and the like. Alternatively or in addition, any of the functionality described herein is performable, at least in part, by one or more hardware logic components, such as, and without limitation, Field-programmable Gate Arrays (FPGAs), Application-specific Integrated Circuits (ASICs), Application-specific Standard Products (ASSPs), System-on-a-chip systems (SoCs), Complex Programmable Logic Devices (CPLDs), and the like. The order in which the methods are described is not intended to be construed as a limitation, and any number or combination of the described method operations are able to be performed in any order to perform a method, or an alternate method.

Having described example procedures in accordance with one or more implementations, consider now an example system and device that are able to be utilized to implement the various techniques described herein.

Example System and Device

Figure 10:
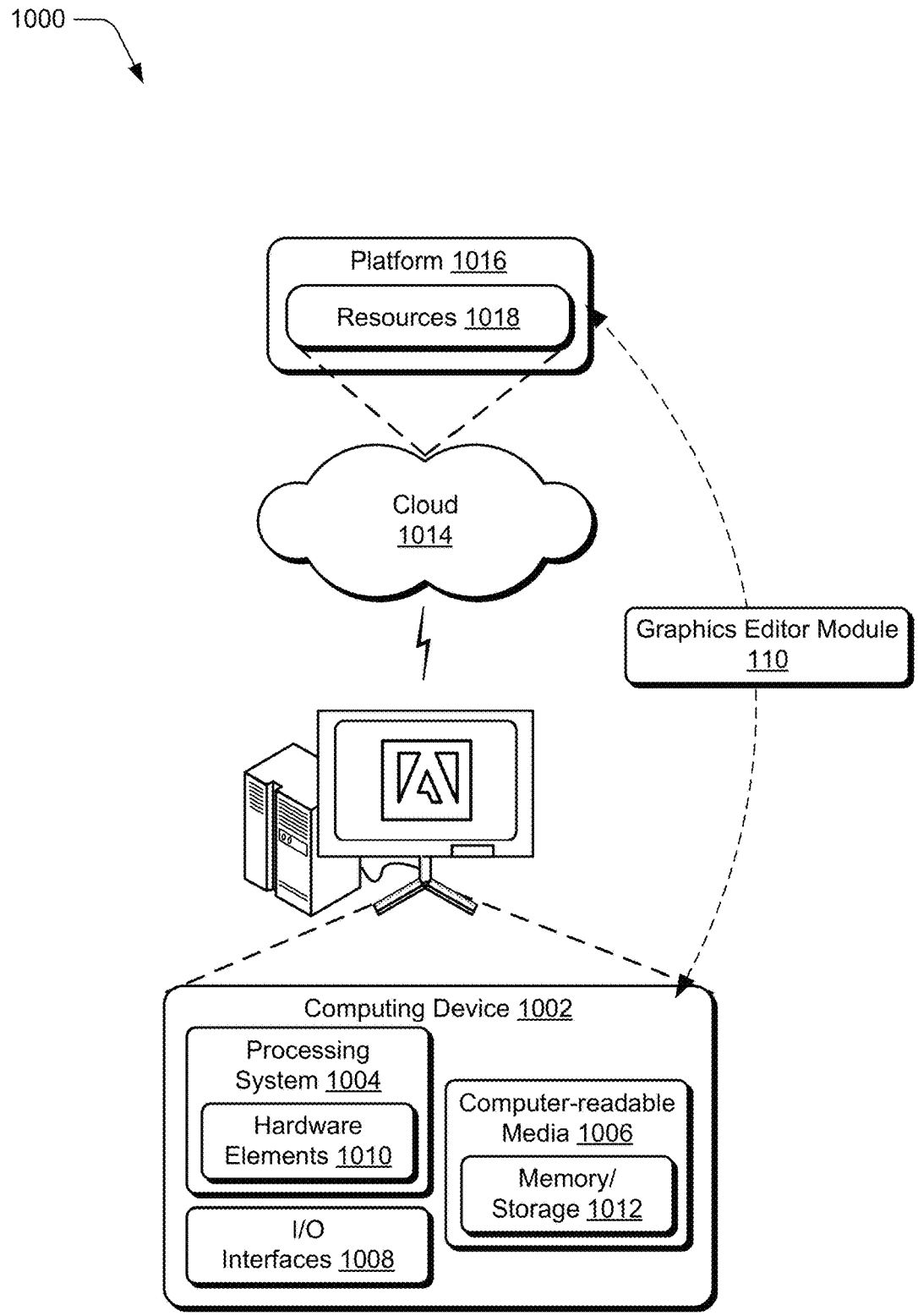
FIG. 10 illustrates an example system including various components of an example device that are implementable as any type of computing device as described and/or utilized with reference to FIGS. 1-9 to implement aspects of the techniques described herein.

FIG. 10 illustrates an example system 1000 that includes an example computing device 1002 that is representative of one or more computing systems and/or devices that are usable to implement the various techniques described herein. This is illustrated through inclusion of the graphics editor module 110. The computing device 1002 includes, for example, a server of a service provider, a device associated with a client (e.g., a client device), an on-chip system, and/or any other suitable computing device or computing system.

The example computing device 1002 as illustrated includes a processing system 1004, one or more computer-readable media 1006, and one or more I/O interfaces 1008 that are communicatively coupled, one to another. Although not shown, the computing device 1002 further includes a system bus or other data and command transfer system that couples the various components, one to another. For example, a system bus includes any one or combination of different bus structures, such as a memory bus or memory controller, a peripheral bus, a universal serial bus, and/or a processor or local bus that utilizes any of a variety of bus architectures. A variety of other examples are also contemplated, such as control and data lines.

The processing system 1004 is representative of functionality to perform one or more operations using hardware. Accordingly, the processing system 1004 is illustrated as including hardware elements 1010 that are be configured as processors, functional blocks, and so forth. This includes example implementations in hardware as an application specific integrated circuit or other logic device formed using one or more semiconductors. The hardware elements 1010 are not limited by the materials from which they are formed or the processing mechanisms employed therein. For example, processors are comprised of semiconductor(s) and/or transistors (e.g., electronic integrated circuits (ICs)). In such a context, processor-executable instructions are, for example, electronically-executable instructions.

The computer-readable media 1006 is illustrated as including memory/storage 1012. The memory/storage 1012 represents memory/storage capacity associated with one or more computer-readable media. In one example, the memory/storage 1012 includes volatile media (such as random access memory (RAM)) and/or nonvolatile media (such as read only memory (ROM), Flash memory, optical disks, magnetic disks, and so forth). In another example, the memory/storage 1012 includes fixed media (e.g., RANI, ROM, a fixed hard drive, and so on) as well as removable media (e.g., Flash memory, a removable hard drive, an optical disc, and so forth). The computer-readable media 1006 is configurable in a variety of other ways as further described below.

Input/output interface(s) 1008 are representative of functionality to allow a user to enter commands and information to computing device 1002, and also allow information to be presented to the user and/or other components or devices using various input/output devices. Examples of input devices include a keyboard, a cursor control device (e.g., a mouse), a microphone, a scanner, touch functionality (e.g., capacitive or other sensors that are configured to detect physical touch), a camera (e.g., which employs visible or non-visible wavelengths such as infrared frequencies to recognize movement as gestures that do not involve touch), and so forth. Examples of output devices include a display device (e.g., a monitor or projector), speakers, a printer, a network card, tactile-response device, and so forth. Thus, the computing device 1002 is configurable in a variety of ways as further described below to support user interaction.

Various techniques are described herein in the general context of software, hardware elements, or program modules. Generally, such modules include routines, programs, objects, elements, components, data structures, and so forth that perform particular tasks or implement particular abstract data types. The terms "module," "functionality," and "component" as used herein generally represent software, firmware, hardware, or a combination thereof. The features of the techniques described herein are platform-independent, meaning that the techniques are implementable on a variety of commercial computing platforms having a variety of processors.

Implementations of the described modules and techniques are storable on or transmitted across some form of computer-readable media. For example, the computer-readable media includes a variety of media that that is accessible to the computing device 1002. By way of example, and not limitation, computer-readable media includes "computer-readable storage media" and "computer-readable signal media."

"Computer-readable storage media" refers to media and/or devices that enable persistent and/or non-transitory storage of information in contrast to mere signal transmission, carrier waves, or signals per se. Thus, computer-readable storage media refers to non-signal bearing media. The computer-readable storage media includes hardware such as volatile and non-volatile, removable and non-removable media and/or storage devices implemented in a method or technology suitable for storage of information such as computer readable instructions, data structures, program modules, logic elements/circuits, or other data. Examples of computer-readable storage media include, but are not limited to, RAM, ROM, EEPROM, flash memory or other memory technology, CD-ROM, digital versatile disks (DVD) or other optical storage, hard disks, magnetic cassettes, magnetic tape, magnetic disk storage or other magnetic storage devices, or other storage device, tangible media, or article of manufacture suitable to store the desired information and which are accessible to a computer.

"Computer-readable signal media" refers to a signal-bearing medium that is configured to transmit instructions to the hardware of the computing device 1002, such as via a network. Signal media typically embodies computer readable instructions, data structures, program modules, or other data in a modulated data signal, such as carrier waves, data signals, or other transport mechanism. Signal media also include any information delivery media. The term "modulated data signal" means a signal that has one or more of its characteristics set or changed in such a manner as to encode information in the signal. By way of example, and not limitation, communication media include wired media such as a wired network or direct-wired connection, and wireless media such as acoustic, RF, infrared, and other wireless media.

As previously described, hardware elements 1010 and computer-readable media 1006 are representative of modules, programmable device logic and/or fixed device logic implemented in a hardware form that is employable in some embodiments to implement at least some aspects of the techniques described herein, such as to perform one or more instructions. Hardware includes components of an integrated circuit or on-chip system, an application-specific integrated circuit (ASIC), a field-programmable gate array (FPGA), a complex programmable logic device (CPLD), and other implementations in silicon or other hardware. In this context, hardware operates as a processing device that performs program tasks defined by instructions and/or logic embodied by the hardware as well as a hardware utilized to store instructions for execution, e.g., the computer-readable storage media described previously.

Combinations of the foregoing are also employable to implement various techniques described herein. Accordingly, software, hardware, or executable modules are implementable as one or more instructions and/or logic embodied on some form of computer-readable storage media and/or by one or more hardware elements 1010. For example, the computing device 1002 is configured to implement particular instructions and/or functions corresponding to the software and/or hardware modules. Accordingly, implementation of a module that is executable by the computing device 1002 as software is achieved at least partially in hardware, e.g., through use of computer-readable storage media and/or hardware elements 1010 of the processing system 1004. The instructions and/or functions are executable/operable by one or more articles of manufacture (for example, one or more computing devices 1002 and/or processing systems 1004) to implement techniques, modules, and examples described herein.

The techniques described herein are supportable by various configurations of the computing device 1002 and are not limited to the specific examples of the techniques described herein. This functionality is also implementable entirely or partially through use of a distributed system, such as over a "cloud" 1014 as described below.

The cloud 1014 includes and/or is representative of a platform 1016 for resources 1018. The platform 1016 abstracts underlying functionality of hardware (e.g., servers) and software resources of the cloud 1014. For example, the resources 1018 include applications and/or data that are utilized while computer processing is executed on servers that are remote from the computing device 1002. In some examples, the resources 1018 also include services provided over the Internet and/or through a subscriber network, such as a cellular or Wi-Fi network.

The platform 1016 abstracts the resources 1018 and functions to connect the computing device 1002 with other computing devices. In some examples, the platform 1016 also serves to abstract scaling of resources to provide a corresponding level of scale to encountered demand for the resources that are implemented via the platform. Accordingly, in an interconnected device embodiment, implementation of functionality described herein is distributable throughout the system 1000. For example, the functionality is implementable in part on the computing device 1002 as well as via the platform 1016 that abstracts the functionality of the cloud 1014.

CONCLUSION

Although the invention has been described in language specific to structural features and/or methodological acts, it is to be understood that the invention defined in the appended claims is not necessarily limited to the specific features or acts described. Rather, the specific features and acts are disclosed as example forms of implementing the claimed invention.

What is claimed is:

1. A method implemented by at least one computing device for generating a vector representation of a visual object, the method comprising:
   generating, by an encoder module, a global latent code of a raster-based input visual object by encoding visual components of the input visual object into the global latent code;
   generating, by a path generator module, path latent codes from the global latent code of the input visual object by decoding the global latent code into different individual path latent codes that each represent a different visual component of the input visual object;

decoding, by a path decoder module, the path latent codes into different respective vector representations of the visual components by generating, for each path latent code, a set of control points on a data path and deforming the data path relative to the control points to generate a respective vector representation; and generating, by a rasterizer module, an output visual object by converting the vector representations into respective raster representations and compositing the raster representations into the output visual object.

2. A method as described in claim 1, wherein said encoding the visual components of the input visual object into the global latent code comprises encoding the visual components as a set of closed data paths that combine to form the input object.

3. A method as described in claim 2, wherein at least some of the closed data paths are implemented as sets of Bézier curves.

4. A method as described in claim 1, wherein said encoding the visual components of the input visual object into the global latent code comprises encoding the visual components as a set of closed data paths that combine to form the input object, and wherein said decoding the global latent code into different individual path latent codes comprises decoding each closed data path into a respective path latent code.

5. A method as described in claim 1, wherein said generating a set of control points for a particular path latent code comprises:
determining, by the path decoder module, a geometric complexity of a visual component of the input visual object represented by the particular path latent code; and
determining, by the path decoder module, a number of control points for a data path to represent the visual component based on the geometric complexity.

6. A method as described in claim 1, wherein said generating a set of control points for a particular path latent code comprises representing, by a control point module, each control point with a control point vector that identifies cartesian coordinates of the control point relative to the data path and includes an endpoint indicator that indicates whether the control point is an endpoint of a segment along the data path.

7. A method as described in claim 1, wherein said deforming the data path relative to the control points comprises:
adjusting, by an adaptive resampler module, at least some of the control points on the data path by determining a geometry of a visual component represented by the data path, generating displacement values for the at least some of the control points to position the at least some of the control points based on the geometry, and positionally adjusting the at least some of the control points on the data path based on respective displacement values; and
deforming, by a path decoder module, the data path about the adjusted control points to simulate the geometry of the visual component.

8. A method as described in claim 1, wherein said generating the path latent codes comprises one or more of:
sampling, by the path generator module, one or more data points from the global latent code to generate one or more of the individual path latent codes; or
interpolating, by the path generator module, a new data point from within the global latent code to generate one or more of the individual path latent codes.

9. A method as described in claim 1, wherein said generating, for each path latent code, a set of control points includes determining a number of control points in the set of control points based at least in part on user input specifying a level of fidelity for representing the visual components of the input visual object via the vector representations.

10. In a digital medium graphics editing environment, a system comprising:
an encoder module implemented at least partially in hardware of at least one computing device to generate a global latent code of a raster-based input visual object including to encode visual components of the input visual object into the global latent code;
a path generator module implemented at least partially in hardware of the at least one computing device to generate path latent codes from the global latent code of the input visual object including to decode the global latent code into different individual path latent codes that each represent a different visual component of the input visual object;
a path decoder module implemented at least partially in hardware of the at least one computing device to decode the path latent codes into different respective vector representations of the visual components including to generate, for each path latent code, a set of control points on a data path and to deform the data path relative to the control points to generate a respective vector representation; and
a rasterizer module implemented at least partially in hardware of the at least one computing device to generate an output visual object including to convert the vector representations into respective raster representations and composite the raster representations into the output visual object.

11. A system as described in claim 10, wherein the encoder module is implemented to encode the visual components of the input visual object into the global latent code including to encode each visual component as a closed path such that the encoded visual components combine to represent a visual appearance of the input visual object.

12. A system as described in claim 10, wherein:
the encoder module is implemented to encode the visual components of the input visual object into the global latent code including to encode each visual component as a closed path such that the encoded visual components combine to represent a visual appearance of the input visual object; and
the path decoder module is implemented to decode the global latent code into different individual path latent codes including to decode each representation of a closed data path into a respective path latent code.

13. A system as described in claim 10, wherein the path decoder module is implemented to generate the set of control points for each path latent code including to:
determine a geometric complexity of a visual component of the input visual object represented by each path latent code; and
determine a number of control points for a data path to represent the visual component based on the geometric complexity.

14. A system as described in claim 10, wherein the path decoder module comprises:
an adaptive resampler module implemented at least partially in hardware of the at least one computing device to, for each data path, adjust at least some of the control points on the data path by determining a geometry of a visual component represented by the data path, generate displacement values for the at least some of the control points to position the at least some of the control points based on the geometry, and positionally adjust the at least some of the control points on the data path based on respective displacement values; and a path deformation module implemented at least partially in hardware of the at least one computing device to deform the data path about the adjusted control points to simulate the geometry of the visual component.

15. A system as described in claim 10, wherein to generate a set of control points for each path latent code includes to implement the path decoder module to determine a number of control points in the set of control points based at least in part on user input specifying a level of fidelity for representing the visual components of the input visual object via the vector representations.

16. A system as described in claim 10, further comprising a vector graphics module implemented at least partially in hardware of the at least one computing device to train the system including to:

cause the rasterizer module to convert individual vector representations into respective raster representations of different visual resolution levels;

calculate, by the vector graphics module, a loss value between each of the raster representations at the different visual resolution levels and the input visual object; and backpropagating, by the vector graphics module, the loss values through the system to minimize a loss between the output visual object and the input visual object.

17. A system as described in claim 10, further comprising a vector graphics module implemented at least partially in hardware of the at least one computing device to train the system using the raster-based input visual object for supervision and without utilizing vector-based supervision.

18. One or more non-transitory computer-readable media storing instructions that are executable to perform operations comprising:

generating a global latent code of a raster-based input visual object by encoding visual components of the input visual object into the global latent code;

generating path latent codes from the global latent code of the input visual object by decoding the global latent code into different individual path latent codes that each represent a different visual component of the input visual object;

decoding the path latent codes into different respective vector representations of the visual components by generating, for each path latent code, a set of control points on a data path and deforming the data path relative to the control points to generate a respective vector representation; and generating an output visual object by converting the vector representations into respective raster representations and compositing the raster representations into the output visual object.

19. One or more non-transitory computer-readable media as described in claim 18, wherein said encoding the visual components of the input visual object into the global latent code comprises encoding the visual components as a set of closed data paths that combine to form the input object.

20. One or more non-transitory computer-readable media as described in claim 19, wherein at least some of the closed data paths are implemented as sets of Bézier curves.

* * * * *